United States Patent [19]

Watanabe et al.

[11] Patent Number: 5,747,216
[45] Date of Patent: May 5, 1998

[54] PRESENSITIZED PLATE COMPRISING TWO PHOTOSENSITIVE LAYERS WHEREIN THE LAYER ADJACENT TO THE SUPPORT HAS A LOWER CONCENTRATION OF DYE THAN THE OTHER LAYER

[75] Inventors: Takuo Watanabe; Yasuhito Naruse; Kotaro Yamasue, all of Shizuoka-ken, Japan

[73] Assignee: Fuji Photo Film Co, Ltd., Minami-ashigara, Japan

[21] Appl. No.: 714,568

[22] Filed: Jun. 13, 1991

[30] Foreign Application Priority Data

Jun. 15, 1990 [JP] Japan ................. 2-156743

[51] Int. Cl.$^6$ .................. G03F 7/095; G03F 7/023
[52] U.S. Cl. .......... 430/156; 430/166; 430/191; 430/192; 430/193; 430/273.1; 430/278.1; 430/302
[58] Field of Search ................... 430/156, 166, 430/165, 192, 191, 193, 302, 278, 273, 168, 169; 101/456, 457, 459, 463.1

[56] References Cited

U.S. PATENT DOCUMENTS

| | | | |
|---|---|---|---|
| 4,217,407 | 8/1980 | Watanabe et al. | 430/156 |
| 4,307,172 | 12/1981 | Ishihara et al. | 430/166 |
| 4,356,254 | 10/1982 | Takahashi et al. | 430/166 |
| 4,464,458 | 8/1984 | Chow et al. | 430/156 |
| 4,497,888 | 2/1985 | Nishioka et al. | 430/302 |
| 4,504,566 | 3/1985 | Dueber | 430/166 |
| 4,536,465 | 8/1985 | Uehara et al. | 430/302 |
| 4,626,492 | 12/1986 | Eilbeck | 430/166 |
| 4,680,244 | 7/1987 | Lehmann et al. | 430/156 |
| 4,840,867 | 6/1989 | Elsaesser et al. | 430/156 |
| 4,842,982 | 6/1989 | Seibel et al. | 430/156 |
| 4,863,827 | 9/1989 | Jain et al. | 430/156 |

*Primary Examiner*—John S. Chu
*Attorney, Agent, or Firm*—Burns, Doane, Swecker & Mathis, LLP

[57] ABSTRACT

A presensitized plate which comprises a roughened and anodized aluminum plate having provided thereon a positive working light-sensitive composition layer which comprises a dye and can be made soluble in a developer upon exposure to light, wherein the dye concentration in the portion of the light-sensitive layer adjacent to or near the substrate is lower than that in the other portions of the light-sensitive layer.

The presensitized plate according to the present invention has less color staining than PS plates of the prior art do and thus has excellent examining properties for plate-quality. The presensitized plate also has remarkable advantages of less stains around image-deleted areas during printing and high printing durability.

15 Claims, No Drawings ns of sulfonate salts such as those disclosed in U.S. Pat. No. 3,181,461 was carried out using 1 N HCl aqueous solution at a current density of 15 A/dm² for 30 seconds.
PRESENSITIZED PLATE COMPRISING TWO PHOTOSENSITIVE LAYERS WHEREIN THE LAYER ADJACENT TO THE SUPPORT HAS A LOWER CONCENTRATION OF DYE THAN THE OTHER LAYER

BACKGROUND OF THE INVENTION

The present invention relates to a positive working presensitized plate, and more specifically to a positive working presensitized plate which comprises an anodized aluminum plate and a positive working light-sensitive composition layer applied thereover.

A lithographic printing plate is obtained by imagewise exposing to light a presensitized plate which comprises an aluminum plate and a light-sensitive composition provided thereon in the form of a thin film and thereafter developing the plate. A presensitized plate (hereinafter referred to as "PS plate") is generally prepared by subjecting the aluminum plate to surface roughening treatment by mechanical methods such as brush graining and ball graining, electrochemical methods such as electrolytic graining, or a combination thereof, etching and anodizing the resulting plate and optionally rendering the surface of the plate hydrophilic to obtain a lithographic substrate and providing a light-sensitive layer thereon. The obtained PS plate is generally subjected to an imagewise exposure to light, development, correction and gumming-up to prepare a lithographic printing plate. The lithographic printing plate is mounted on a printing press and a printing operation is carried out.

However, in a lithographic printing plate prepared by imagewise exposing to light a positive working PS plate and developing the exposed plate there has been a problem that non-image areas of the plate adsorb some materials contained in a light-sensitive layer to cause contamination of the non-image areas, so called "background contamination" so that it is difficult to distinguish image areas from the non-image areas in a correction step. Further a trace of correction is remained to form an unsmooth lithographic printing plate. If the trace of correction is in a high degree, it causes a stain resulting in the lithographic printing plate being unusable. As the amount of an anodized aluminum layer increases, these problems become more remarkable.

In order to solve the problems, various methods have been proposed. Examples of the methods include, for example, a method of dipping an anodized aluminum substrate in an alkali metal silicate such as those disclosed in U.S. Pat. No. 3,181,461, a method of undercoating a hydrophilic cellulose containing a water-soluble metal salt such as those disclosed in U.S. Pat. No. 3,860,426, a method of undercoating sodium arylsulfonate such as those disclosed in G.B.Patent No. 2,098,627 and a method of undercoating polyacrylamide disclosed in U.S. Pat. No. 3,511,661, polyvinylphosphonic acid disclosed in J.P.KOKOKU No. Sho 46-35685 (U.S. Pat. No. 4,153,461), amino acid and salts thereof such as an alkali metal salt of sodium salt, potassium salt and the like, an ammonium salt, hydrochloride, oxalate, acetate, phosphate and the like disclosed in J.P.KOKAI No. Sho 60-149491 (U.S. Pat. No. 4,801,527), amines having hydroxyl groups and salts thereof disclosed in J.P.KOKAI No. Sho 60-232998 (U.S. Pat. No. 4,801,527) or a compound having amino and phosphonic groups and salts thereof, which is dislosed in J.P.KOKAI No. Sho 63-165183 and the like. However, these methods have disadvantages such as insufficient reduction of background contamination, incomplete suppression of the above mentioned "stain" and great decrease of printing durability due to insufficient adhesion of a light-sensitive composition to a substrate.

SUMMARY OF THE INVENTION

Accordingly, an object of the present invention is to provide a presensitized plate which has less color remaining when imagewise exposed to light and developed and thus provides a lithographic printing plate which produces less background contamination.

Another object of the present invention is to provide a PS plate which produces a lithographic printing plate which has excellent printing durability because of strong adhesion of a light-sensitive composition in an image area to a substrate.

The aforementioned objects of the present invention can effectively be accomplished by providing a positive working PS plate which comprises a grained and anodized aluminum plate having provided thereon a positive working light-sensitive composition layer which comprises a dye and can be made soluble in a developer upon exposure to light, wherein the dye concentration in the portion of the light-sensitive layer adjacent to or near the substrate is lower than that in the other portions of the light-sensitive layer.

DETAILED EXPLANATION OF THE INVENTION

The present invention will hereunder be described in more detail.

The dye may be present in the light-sensitive layer in any concentration distribution as long as the dye concentration is lower in the portion of the light-sensitive layer adjacent to or near the substrate than in the other portions of the light-sensitive layer. Preferably, the dye content in the half of (in terms of thickness) of the light-sensitive layer adjacent to or near the substrate is lower than that in the remaining half of the light-sensitive layer. More preferably, the dye content in the first 30% (in terms of thickness) of the light sensitive layer adjacent to or near the substrate is lower than in the portion of the remaining 70% of the light-sensitive layer.

Further, it is preferred that the portion of the light-sensitive layer remote from the substrate contains more than 60% by weight of the dye and the portion of the light-sensitive layer adjacent to or near the substrate contains less than 40% by weight of the dye based on the total weight of the dye. More preferably, the portion of the light-sensitive layer remote from the substrate contains more than 70% by weight of the dye and the portion of the light-sensitive layer adjacent to or near the substrate contains less than 30% by weight of the dye based on the total weight of the dye.

A PS plate having the above dye distribution can be prepared by coating in order coating solutions having the same composition but different dye concentration on the substrate.

Any dyes which are known as image colorants can be used in the PS plate of the present invention. Typical examples of the dyes include an agent for obtaining a visible image immediately after imagewise exposure to light as a salt-forming organic dye which is used in a combination with a light-sensitive compound which releases an acid upon exposure to light. More specifically, examples of the combinations of the light-sensitive compounds and the dyes include a combination of o-naphthoquinonediazide-4-sulfonyl halide and a salt-forming organic dye disclosed in J.P.KOKAI Nos. Sho 50-36209 (U.S. Pat. No. 3,969,118) and Sho 53-8128 and a combination of a trihalomethyl compound and a salt forming organic dye disclosed in J.P.KOKAI Nos. Sho 53-36223 (U.S. Pat. No. 4,160,671), Sho 54-74728 (U.S. Pat. No. 4,232,106), Sho 60-3626, Sho 61-143748, Sho 61-151644 and Sho 63-58440. Dyes other than the above salt-forming organic dyes can be used as a colorant of image. Preferred examples of the dyes including salt-forming organic dyes include oil-soluble dyes and basic dyes. More specifically, examples of such dyes include Oil Yellow #101, Oil Yellow #130, Oil Pink #312, Oil Green BG, Oil Blue BOS, Oil Blue #603, Oil Black BY, Oil Black BS, Oil Black T-505 (available from Orient Chemical Industry Co.), Victoria Pure Blue, crystalviolet (CI42555), methylviolet (CI42535), rhodamine B (CI45170B), malachite green (CI42000), methylene blue (CI52015) and the like. A dye disclosed in J.P.KOKAI No. Sho 62-293247 is especially preferred.

The dyes are suitably contained in the light-sensitive layer in an amount of from 0.01 to 10% by weight, preferably from 0.05 to 5% by weight based on the total weight of the light-sensitive composition.

Any light-sensitive composition can be used in the PS plate of the present invention as long as solubility or swellability in a developer changes after exposure to light. Typical examples of the light-sensitive compositions are illustrated hereinafter.

Examples of the positive working light-sensitive compounds include o-quinonediazide compounds and the typical examples thereof include o-naphthoquinonediazide compounds.

Preferred examples of the o-quinonediazide compounds include an ester of 1,2-naphthoquinone (2) diazide-5-sulfonyl chloride and a pyrogallol-acetone resin, which is disclosed in J.P.KOKOKU No. Sho 43-28403 (U.S. Pat. No. 3,635,709). Other preferred examples of the o-quinonediazide compounds include an ester of 1,2-naphthoquinone (2) diazide-5-(or -4-)-sulfonyl chloride and a phenol-formaldehyde resin, which is disclosed in U.S. Pat. Nos. 3,046,120 and 3,188,210. The other useful examples of the o-quinonediazide compounds include compounds disclosed in many patent publications, for example, such as J.P.KOKAI Nos. Sho 47-5303, Sho 48-63802, Sho 48-63803, Sho 48-96575, Sho 49-38701, Sho 48-13354, Sho 51-139402, Sho 58-150948, Sho 58-203434, Sho 59-165053, Sho 60-121445, Sho 60-134235, Sho 60-163043, Sho 61-118744, Sho 62-10645, Sho 62-10646, Sho 62-153950, Sho 62-178562 and Sho 64-76047, J.P.KOKOKU Nos. Sho 37-18015, Sho 41-11222, Sho 45-9610 and Sho 49-17481, U.S. Pat. Nos. 2,797,213, 3,454,400, 3,544,323, 3,573,917, 3,674,495, 3,785,825, 3,102,809, 3,126,281, 3,130,047, 3,148,983, 3,184,310, 3,188,210 and 4,639,406, G.B.Patent Nos. 1,227,602, 1,251, 345, 1,267,005, 1,329,888 and 1,330,932 and German Patent No. 854,890.

Preferably, o-naphthoquinone diazide compounds are prepared by reacting from 0.2 to 1.2, more preferably, from 0.3 to 1.0 equivalence of 1,2-naphthoquinone (2) diazide-5-(or -4-)sulfonyl chloride with 1 equivalence of a hydroxyl group of polyhydroxy compounds.

Polymers having ortho-nitrocabinol ester groups, which are disclosed in J.P.KOKOKU No. 56-2696 (U.S. Pat. No. 3,849,137), can be used as positive working light-sensitive compounds instead of the o-naphthoquinonediazide compounds.

Further, combinations of compounds which generate acids photolytically and compounds having —C—O—C or —C—O—Si groups which is dissociated by acids can be used in the light-sensitive compounds of the PS plate of the present invention.

Examples of the combinations include combinations of compounds which generate photolytically acids and acetal or O,N-acetal compounds (J.P.KOKAI No. Sho 48-89003) (U.S. Pat. No. 3,779,778), orthoester or amideacetal compounds (J.P.KOKAI No. Sho 51-120714) (U.S. Pat. No. 4,101,323), polymers which have acetal or ketal groups on the main chain (J.P.KOKAI No. Sho 53-133429) (U.S. Pat. No. 4,247,611), enolester compounds (J.P.KOKAI No. Sho 55-12995) (U.S. Pat. No. 4,248,957), N-acylimino carbon compounds (J.P.KOKAI No. Sho 55-126236) (U.S. Pat. No. 4,250,247), polymers which have orthoester groups on the main chain (J.P.KOKAI No. Sho 56-17345) (U.S. Pat. No. 4,311,782), silylester compounds (J.P.KOKAI No. Sho 60-10247) (U.S. Pat. No. 4,752,552) or silylether compounds (J.P.KOKAI Nos. Sho 60-37549 and Sho 60-121446) (U.S. Pat. No. 4,816,375) and the like.

The amount of the o-quinonediazide compounds (including combinations illustrated above) is preferably from 10 to 50% by weight and more preferably 15 to 40% by weight based on the total weight of the light-sensitive composition.

These o-quinonediazide compounds may be used alone, but are preferably used as a mixture with an alkali-soluble resin which functions as a binder. Preferred examples of the alkali-soluble resins include alkali-soluble novolak resins. The examples of the alkali-soluble novolak resins include a cresol-formaldehyde resin such as a phenol-formaldehyde resin, a m-cresol-formaldehyde resin, a p-cresol-formaldehyde resin, a m-/p-cresol-formaldehyde resin, a phenol/cresol-(including m-, p-, or m-/p-copolycondensed) formaldehyde resin; a phenol modified xylene resin; polyhydroxystyrene; polyhalogenated hydroxystyrene; an acrylic resin having phenolic hydroxyl groups, such as those disclosed in J.P.KOKAI No. Sho 51-34711; an acylic resin having sulfoneamide groups, which is disclosed in J.P.KOKAI Hei No. 2-866; an urethane resin and the like. The weight-average molecular weight of the alkali-soluble polymer is preferably from 500 to 20,000 and the number-average molecular weight thereof is preferably from 200 to 60,000.

The alkali-soluble polymer can be used in an amount of less than 95% by weight, preferably from 50 to 90% based on the total weight of the light-sensitive composition.

Further, a condensation product of phenol which has alkyl groups having from 3 to 8 carbon atoms as substituents and formaldehyde, such as a t-butylphenol-formaldehyde resin and an octylphenol-formaldehyde resin can be preferably added to the positive working light-sensitive composition in order to improve ink receptivity of image areas.

The light-sensitive composition used in the PS plate of the present invention may further contain cyclic acid anhydrides for improving sensitivity of the PS plate, agents or compositions for obtaining a visible image immediately after imagewise exposure to light, the other fillers and the like. Examples of the cyclic acid anhydrides include phthalic anhydride, tetrahydro phthalic anhydride, hexahydro phthalic anhydride, 3,6-endoxy-$\Delta^4$-tetrachloro phthalic anhydride, tetrachloro phthalic anhydride, maleic anhydride, chloro maleic anhydride,α-phenyl maleic anhydride, succinic anhydride, pyromellitic anhydride and the like, which are all disclosed in U.S. Pat. No. 4,115,128. Sensitivity can become higher up to about 3 times by adding from 1 to 15% by weight of the cyclic acid anhydrides based on the total weight of the light-sensitive composition.

The light-sensitive composition is dissolved in a solvent which dissolves each of the above components and is applied on the substrate to prepare a PS plate. Examples of the solvents include ethylene dichloride, cyclohexanone, methyl ethyl ketone, ethyleneglycol-mono-methylether, ethyleneglycol-mono-ethylether, 2-methoxyethylacetate, 1-methoxy-2-propanol, 1-methoxy-2-propylacetate, toluene, ethyl acetate, methyl lactate, ethyl lactate, dimethyl sulfoxide, dimethyl acetamide, dimethyl formamide, water, N-methyl pyrrolidone, tetrahydrofurfuryl alcohol, acetone, diacetone alcohol, methanol, ethanol, isopropanol, diethyleneglycol-dimethylether, a mixture thereof, and the like.

The light-sensitive composition used in the PS plate of the present invention may furthermore contain surfactants, such as fluorine-atom containing surfactants such as those disclosed in J.P. KOKAI No. Sho 62-170950 (U.S. Pat. No. 4,822,713), in order to improve coating properties. The ratio of the surfactant to the light-sensitive composition is preferably from 0.01 to 1% by weight, more preferably from 0.05 to 0.5% by weight based on the total weight of the light-sensitive composition.

The solid concentration of the above light-sensitive composition is from 2 to 50% by weight. The light-sensitive layer may be applied on the substrate by any conventional coating process. Typical coating processes include rotary coating, wire bar coating, dip coating, air knife coating, roll coating, blade coating, curtain coating, spray coating and the like. Among them, electrostatic spray coating process is especially preferred, which is, for example, disclosed in J.P.Serial No. Hei 2-41135 (U.S. application Ser. No. 658, 891 filed Feb. 22, 1991). The preferred coating amount of the light-sensitive composition is generally from 0.5 to 3.0 g/m$^2$, which can be modified depending on use. As the amount of the light-sensitive composition decreases, the sensitivity of the PS plate becomes higher but physical properties of the light-sensitive composition film become lower.

A printing frame is usually drawn to vaccum when an original film is contacted with a PS plate for printing. The PS plate of the present invention can be treated by methods for improving close contact between a PS plate and an original film under reduced pressure. Examples of the methods include a method of making mechanically the surface of a light-sensitive layer uneven, a method of spraying solid powders on the surface of a light-sensitive layer, a method of applying a mat layer on the surface of a light-sensitive layer as described in J.P. KOKAI Nos. Sho 50-125805 (U.S. Pat. No. 4,268,611), Sho 51-111102 (U.S. Pat. No. 4,288, 526), Sho 52-29302 (U.S. Pat. No. 4,126,460) and Sho 57-34558 (U.S. Pat. No. 4,626,484), a method of heat-fusing solid powders on the surface of a light-sensitive layer as described in J.P. KOKAI No. Sho 55-12974 and the like.

Examples of the aluminum plate which can be used in the PS plate of the present invention include pure aluminum and aluminum alloy plates which comprise aluminum as a main component and the other atoms in a trace amount. Examples of the other atoms include silicon, iron, manganese, copper, magnesium, chromium, zinc, bismuth, nickel, titanium and the like. The ratio of the other atoms to the aluminum alloy may be up to 10% by weight based on the total weight of the aluminum alloy. Pure aluminum is the most preferred for the PS plate of the present invention. However, aluminum alloys containing the least possible amount of the other atoms is preferred because pure aluminum can not be easily obtained by refining techniques. Any aluminum alloy which contains the ratio of the other atoms can be used as a material of the PS plate of the present invention. Thus, any known and/or used aluminum materials can be suitably used in the PS plate of the present invention but are not limited to specific ones. The thickness of the aluminum plate is from about 0.1 to about 0.5 mm.

Prior to graining, an aluminum plate can optionally be treated to remove rolling oil from the surface of the plate, for example, by degreasing treatment with a surfactant or an alkaline aqueous solution. The PS plate of the present invention may be usable on one side or be usable on both sides. The PS plate of the present invention can be prepared to be usable on both sides by treating both surfaces of the aluminum plate by the same processes. Treatments of one side of the aluminum plate will be explained hereinafter and the same treatments can be applied to the other side of the aluminum plate.

An aluminum plate is grained by various methods. Examples of the graining methods include a mechanical method of roughening the surface of the aluminum plate, an electrochemical method of dissolving the surface of the aluminum plate and a chemical method of selectively dissolving the surface of the aluminum plate. Examples of the mechanical methods include conventional methods such as ball graining, brush graining, blast graining, buff graining and the like. Examples of the electrochemical methods include a method of applying an alternating or a direct current to the plate in a hydrochloric acid or a nitric acid electrolyte. A combination thereof can be used as described in J.P. KOKAI No. Sho 54-63902.

The aluminum plate thus grained is optionally etched with an alkaline etching agent and then neutralized.

Any electrolyte can be used in anodizing the aluminum plate as long as it forms a porous anodized layer. In general, sulfonic acid, phosphoric acid, oxalic acid, chromic acid and a mixture thereof can be used as an electrolyte. The concentration of the electrolyte can be suitably modified depending on the kind of the electrolyte.

Generally, anodization can be suitably carried out under a condition of an electrolyte concentration of from 1 to 80% by weight, a solution temperature of from 5° to 70° C., a current density of from 5 to 60 A/dm$^2$, a voltage of from 1 to 100V and a time of from 10 seconds to 50 minutes. The condition can be modified depending on the electrolyte to be used.

The aluminum plate may be optionally subjected to sealing by boiling water treatment, water vapor treatment, sodium silicate treatment, dichromate solution treatment and the like.

The amount of the anodized layer is preferably more than 1.0 g/m$^2$, more preferably from 2.0 to 6.0 g/m$^2$. If the amount of the anodized layer is less than 1.0 g/m$^2$, printing durability may be insufficient or non-image areas of the lithographic printing plate may be susceptible to scratches so that a printing ink can be attached to the scratches resulting in "scratch contamination".

The PS plate of the present invention is developed with a suitable developer such as an aqueous solution of an inorganic alkali agent. Typical examples of the inorganic alkali agents include sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, ammonia water and the like. The concentration of the inorganic alkali agent in a developer is from 0.1 to 10% by weight, preferably from 0.5 to 5% by weight based on the total weight of the developer.

The developer may optionally contain surfactants such as those disclosed in J.P.KOKAI Nos. Sho 50-51324 and Sho 59-84241 (U.S. Pat. No. 4,500,625), chelating agents such as those disclosed in J.P.KOKAI No. Sho 58-190952 (U.S. Pat. No. 4,469,776), water-soluble metal salts such as those disclosed in J.P.KOKOKU No. Hei 1-30139 and organic solvents such as alcohols.

The PS plates thus obtained are imagewise exposed to light from a light source such as a carbon arc lamp, a mercury lamp, a xenon lamp, a tungsten lamp and a metal halide lamp.

The PS plate according to the present invention has less remaining color stain than PS plates of the prior art do and thus has excellent examining properties for plate-quality. The PS plate according to the present invention also has remarkable advantages of less stains around image-deleted areas during printing and high printing durability. It has been known that the PS plate which has less contamination resulting in less remaining color stains has lower printing durability and on the contrary the PS plate which has high printing durability has more contamination resulting in more remaining color stains. It is considered to be difficult to obtain the PS plate which has both advantages of less remaining color stains and higher printing durabilities.

The present invention provides the PS plate which has both of the above mentioned advantages.

The present invention will hereunder be explained in more detail with reference to the following non-limitative working Examples. Percentages of the Examples are by weight unless otherwise indicated.

EXAMPLE
(Preparation of an aluminum substrate)

An aluminum plate of 0.30 mm thickness was grained by a nylon brush and with 400 mesh pumice-water suspension and washed with water. The plate was immersed in 10% sodium hydroxide solution in water at 70° C. for 60 seconds to be etched and washed with running water. The plate was neutralized with 20% $HNO_3$ solution in water and washed with water. The plate was anodized using a sine wave alternating current at $V_A$=12.7 V in 1% aqueous solution of nitric acid in the quantity of anode time electricity of 160 coulomb/$dm^2$. The surface roughness of the plate was 0.6μ (expressed in Ra). Subsequently, the plate was immersed in 30% $H_2SO_4$ solution in water at 55° C. for 2 minutes to remove smut and then was anodized at a current density of 2 A/$dm^2$ in 20% $H_2SO_4$ solution in water to produce an aluminum substrate having 2.7 g/$m^2$ of an anodized layer.

(Preparation of PS plate Sample 1)

Sample 1 of a positive working PS plate was prepared by applying Coating solution (1) which has the following formulation on the above prepared aluminum substrate by a spray coating method disclosed in J.P.Serial No. Hei 2-41135 in a solid amount of 0.6 g per $m^2$, applying thereover Coating solution (2) which has the following formulation by the spray coating method in a solid amount of 1.4 g per $m^2$ and drying the resulting plate at 100° C. for 2 minutes.

Formulation of Coating solution (1)

An ester of naphthoquinone-1,2-diazide-5-sulfonylchloride and a pyrogallol-acetone resin (Note 1) [A] 0.45 g Cresol-formaldehyde novolak resin 1.1 g 4-[p-N-(p-hydroxybenzoyl)aminophenyl]-2,6-bis(trichloromethyl]-s-triazine 0.02 g Methyl ethyl ketone 10 g Propylene glycol monomethyl ether 10 g Note 1 . . . as described in Example 1 of U.S. Pat. No. 3,635,709

Formulation of Coating solution (2)

An ester of naphthoquinone-1,2-diazide-5-sulfonylchloride and a pyrogallol-acetone resin (Note 1) [A] 0.45 g Cresol-formaldehyde novolak resin 1.1 g 4-[p-N-(p-hydroxybenzoyl)aminophenyl]-2,6-bis(trichloromethyl]-s-triazine 0.02 g Oil Blue #603 (available from Orient Chemical Industry Co. Ltd.) 0.015 g Methyl ethyl ketone 10 g Propylene glycol monomethyl ether 10 g Note 1 . . . as described in Example 1 of U.S. Pat. No. 3,635,709

(Preparation of PS plate Samples 2–5)

Samples 2–5 of PS plates were prepared by repeating the same procedure as that of Sample 1 except that the coating solutions (1) and (2) and coating amounts of the light-sensitive layers of Sample 1 were replaced by those shown in Table 1.

(Preparation of PS plate Samples 6–10)

Sample 6 of a PS plate was prepared by applying Coating solution (3) which has the following formulation on the above prepared aluminum substrate, applying thereover Coating solution (4) which has the following formulation and drying the resulting plate by repeating the same procedure as that of Sample 1. Further, Samples 7–10 of PS plates were prepared by repeating the same procedure as that of Sample 6 except that the coating solutions (3) and (4) and coating amounts of the light-sensitive layers of Sample 6 were replaced by those shown in Table 1.

Formulation of Coating solution (3)

An ester of naphthoquinone-1,2-diazide-4-sulfonylchloride and a m-cresol-formaldehyde resin (Note 2) [B] 0.5 g Cresol-formaldehyde novolak resin 1.05 g Phthalic anhydride 0.1 g 4-[p-N-(p-hydroxybenzoyl)aminophenyl]-2,6-bis(trichloromethyl)-s-triazine 0.02 g Megafack F-177 (a fluorine-atom containing surfactant available from Dai Nippon Ink and Chemicals Co. Ltd.) 0.005 g Methyl ethyl ketone 10 g Propylene glycol monomethyl ether 10 g Note 2 . . . as prepared in the following Synthetic Example 1

Formulation of Coating solution (4)

An ester of naphthoquinone-1,2-diazide-4-sulfonylchloride and a m-cresol-formaldehyde resin (Note 2) [B] 0.5 g Cresol-formaldehyde novolak resin 1.05 g Phthalic anhydride 0.1 g 4-[p-N-(p-hydroxybenzoyl)aminophenyl]-2,6-bis(trichloromethyl]-s-triazine 0.02 g Victoria Pure Blue-BOH (available from Hodogaya Chemical Co. Ltd.) 0.015 g Megafack F-177 (a fluorine-atom containing surfactant available from Dai Nippon Ink and Chemicals Co. Ltd.) 0.005 g Methyl ethyl ketone 10 g Propylene glycol monomethyl ether 10 g Note 2 . . . as prepared in the following Synthetic Example 1

(Synthetic Example 1)

100 g of m-cresol, 45.0 g of 37% aqueous solution of formalin and 0.05 g of oxalic acid were charged in a three-necked flask and were heated to 100° C. with stirring to react for 7 hours.

Subsequently, water was removed by gradually heating the reaction solution to 200° C. and then unreacting monomers were removed under reduced pressure up to from 1 to 2 mmHg. The gel permeation chromatography (polystyrene standard) of the resulting novolak resin shows 2,000 of the weight-average molecular weight and 1,300 of the number-average molecular weight. 120 g of the novolak resin and 133.6 g of 1,2-naphthoquinone-2-diazide-4-sulfonylchloride were dissolved in 800 ml of tetrahydrofuran. 50.5 g of triethylamine was dropwise added to the resulting solution maintaining the temperature at lower than 30° C. After completing the addition, the solution was stirred at room temperature for 2 hours and then the reaction solution was poured into 10 l of distilled water with stirring. The separated solids were collected by filtration and then were dried under reduced pressure to obtain 190 g of naphthoquinonediazide compound [B].

Comparative Example
(Preparation of PS plate Sample 11)

Sample 11 of a PS plate was prepared by applying the above Coating solution (2) on the above prepared aluminum substrate in a solid amount of 2.0 g per m² by the same coating method as that of Sample 1 and drying the resulting plate at 100° C. for 2 minutes.

(Preparation of PS plate Sample 12)

Sample 12 of a PS plate was prepared by applying the above Coating solution (4) on the above prepared aluminum substrate in a solid amount of 2.0 g per m² by the same coating method as that of Sample 1 and drying the resulting plate at 100° C. for 2 minutes.

The PS plates thus obtained were imagewise exposed, through an original transparency which comprises a transparent base film and 3 positive films attached thereon by Cellotape™, to light from a 3 KW metal halide lamp for 60 seconds. Then the imagewise exposed PS plate was developed using an automatic developing machine which was charged with a developer DP-4 (diluted with water to 1:7) and a rinse FR-2 (diluted with water to 1:7), both available from Fuji Photo Film Co. Ltd. As traces of the film edge and up with the solution which comprises gum GU-7 available from Fuji Photo Film Co. Ltd diluted 2 times with water. After the treated plate was left to stand for 1 day, the plate was mounted on Hidel KOR-D printing press and printing was carried out.

Table 1 shows the results regarding stains around image-deleted areas, printing durability and remaining color stains in non-image areas.

The results shown in Table 1 demonstrate that the samples of the PS plate according to the present invention showed more excellent results regarding remaining color stains in non-image areas, stains around image-deleted areas and printing durability than the comparative samples.

TABLE 1

| Sample No. | O-quinone Compound | | Coating Amount of the Underly- (g/m²) | Coating Amount of the Overly- (g/m²) | Remaining Color *1) | Contamination *2) | Printing *3) |
|---|---|---|---|---|---|---|---|
| 1 | Example | [A] | 0.6 | 1.4 | 0.00 | no | $1 \times 10^6$ |
| 2 | " | " | 0.5 | 1.5 | 0.00 | no | $1 \times 10^6$ |
| 3 | " | " | 0.4 | 1.6 | 0.00 | no | $1 \times 10^6$ |
| 4 | " | " | 0.3 | 1.7 | 0.01 | no | $1 \times 10^6$ |
| 5 | " | " | 0.2 | 1.8 | 0.01 | no | $1 \times 10^6$ |
| 6 | " | [B] | 0.6 | 1.4 | 0.00 | no | $1 \times 10^6$ |
| 7 | " | " | 0.5 | 1.5 | 0.00 | no | $1 \times 10^6$ |
| 8 | " | " | 0.4 | 1.6 | 0.00 | no | $1 \times 10^6$ |
| 9 | " | " | 0.3 | 1.7 | 0.00 | no | $1 \times 10^6$ |
| 10 | " | " | 0.2 | 1.8 | 0.01 | no | $1 \times 10^6$ |
| 11 | Comparative Example | [A] | 2.0 | — | 0.04 | yes | $1 \times 10^6$ |
| 12 | Comparative Example | [B] | 2.0 | — | 0.03 | yes | $1 \times 10^6$ |

*1)Difference ($\Delta D$) between an optical density of a non-image area after development and that of the substrate before application of light-sensitive layers.
*2)Stains around image-deleted areas
*3)The number of normal prints traces of the tape attachment were observed on the resulting lithographic printing plate, the plate was corrected by deleting these traces with a writing brush containing a deleting liquid RP-1 available from Fuji Photo Film Co. Ltd. Then the surface of the plate was washed with water and gummed-

What is claimed is:

1. A presensitized plate which comprises a roughened and anodized aluminum support having provided thereon two positive working light-sensitive layers, one of which layers being a light-sensitive layer adjacent to or near the support and comprising an ester obtained by reacting 1,2-naphthoquinone-2-diazide-5-sulfonyl chloride with a polyhydroxy compound and an alkali-soluble resin that becomes soluble in a developer upon exposure to light and the other light-sensitive layer comprising an ester obtained by reacting 1,2-naphthoquinone-2-diazide-5-sulfonyl chloride with a polyhydroxy compound, an alkali-soluble resin and a dye that becomes soluble in a developer upon exposure to light, wherein a dye concentration in the light-sensitive layer adjacent to or near the support is lower than that in the other light-sensitive layer, and said two light-sensitive layers are obtained by (i) coating on the support a first photosensitive solution being free of a dye and containing the ester obtained by reacting 1,2-naphthoquinone-2-diazide-5-sulfonyl chloride with a polyhydroxy compound, the alkali-soluble resin and a solvent to form the light-sensitive layer adjacent to or near the support, (ii) then coating a second photo-sensitive solution including the ester obtained by reacting 1,2-naphthoquinone-2-diazide-5-sulfonyl chloride with a polyhydroxy compound, the alkali-soluble resin, the dye and a solvent to form the other light-sensitive layer, and (iii) then drying the light-sensitive layers thereby forming the two positive working light-sensitive layers.

2. A presensitized plate which comprises an aluminum support, a surface of which is grained and anodized, and two positive working light-sensitive layers on said surface, one of which layers being a light-sensitive layer adjacent to or near the support and comprising an o-naphthoquinone diazide compound and an alkali-soluble resin that becomes soluble in a developer upon exposure to light and the other light-sensitive layer comprising an o-naphthoquinone diazide compound, an alkali-soluble resin and a dye that becomes soluble in a developer upon exposure to light, wherein the o-naphthoquinone diazide compound contained in the two light-sensitive layers are identical, a dye concentration in the light-sensitive layer adjacent to or near the support is lower than that in the other light-sensitive layer, and said two light-sensitive layers are obtained by (i) coating on the support a first photo-sensitive solution being free of a dye and containing the o-naphthoquinone diazide compound, the alkali-soluble resin and a solvent to form the light-sensitive layer adjacent to or near the support, (ii) then coating a second photo-sensitive solution including the o-naphthoquinone diazide compound, the alkali-soluble resin, the dye and a solvent to form the other light-sensitive layer, and (iii) then drying the light-sensitive layers thereby forming the two positive working light-sensitive layers.

3. The presensitized plate of claim 1, wherein the dye is a salt-forming organic dye which is used in combination with a light-sensitive compound which releases an acid upon exposure to light.

4. The presensitized plate of claim 3, wherein the dye is a salt-forming organic dye which is used in combination with o-naphthoquinonediazide-4-sulfonyl halide or a salt-forming organic dye which is used in combination with a trihalomethyl compound.

5. The presensitized plate of claim 1, wherein the dye is an oil-soluble dye or a basic dye.

6. The presensitized plate of claim 1, wherein the alkali-soluble resin is an alkali-soluble novolak resin.

7. The presensitized plate of claim 1, wherein the weight-average molecular weight of the alkali-soluble resin is from 500 to 20,000 and the number-average molecular weight of the alkali-soluble resin is from 200 to 60,000.

8. The presensitized plate of claim 1, wherein the amount of the ester compound is from 10 to 50% by weight based on the total weight of the light-sensitive composition.

9. The presensitized plate of claim 1, wherein the amount of the alkali-soluble resin is from 50 to 90% by weight based on the total weight of the light-sensitive composition.

10. The presensitized plate of claim 1, wherein the aluminum substrate is anodized by an electrochemical method.

11. The presensitized plate of claim 1, wherein the amount of the anodized layer of the aluminum support is more than 1.0 g/m$^2$.

12. The presensitized plate of claim 11, wherein the amount of the anodized layer is from 2.0 to 6.0 g/m$^2$.

13. The presensitized plate of claim 1, wherein the amount of the dye is from 0.01 to 10% by weight based on the total weight of the light-sensitive composition.

14. The presensitized plate of claim 13, wherein the amount of the dye is from 0.05 to 5% by weight based on the total weight of the light-sensitive composition.

15. The presensitized plate of claim 2, wherein said first and second photo-sensitive solutions are applied by a spray coating method.

* * * * *